United States Patent
Wang et al.

(10) Patent No.: US 6,171,924 B1
(45) Date of Patent: Jan. 9, 2001

(54) METHOD OF FABRICATING A DYNAMIC RANDOM ACCESS MEMORY CAPACITOR

(75) Inventors: Chuan-Fu Wang, Taipei Hsien; J.S. Jason Jenq, Pingtung, both of (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/179,177

(22) Filed: Oct. 27, 1998

(30) Foreign Application Priority Data

Aug. 14, 1998 (TW) ................................................ 87113402

(51) Int. Cl.$^7$ ................................................ H01L 21/8242
(52) U.S. Cl. .................... 438/396; 438/253; 438/254; 438/397
(58) Field of Search ........................ 257/306, 307, 257/308, 309, 532, 296; 438/253, 254, 255, 396, 397, 398, FOR 207, FOR 208, FOR 212, FOR 220, FOR 430

(56) References Cited

U.S. PATENT DOCUMENTS

| | | | |
|---|---|---|---|
| 5,340,763 | * 8/1994 | Dennison | 438/398 |
| 5,438,013 | * 8/1995 | Kim et al. | 438/396 |
| 5,444,005 | * 8/1995 | Kim et al. | 438/396 |
| 5,482,886 | * 1/1996 | Park et al. | 438/397 |
| 5,523,542 | * 6/1996 | Chen et al. | 438/396 |
| 5,837,594 | * 11/1998 | Honma et al. | 438/396 |

* cited by examiner

*Primary Examiner*—Wael Fahmy
*Assistant Examiner*—Toniae M. Thomas
(74) *Attorney, Agent, or Firm*—Oblon, Spivak, McClelland, Maier & Neustadt, P.C.

(57) ABSTRACT

A method of fabricating a capacitor on a substrate. The method includes sequentially forming a first dielectric layer and an etching barrier layer on the substrate, the etching barrier layer and the first dielectric layer having an opening formed therein. A conductive layer is formed on the etching barrier layer and fills the opening. The conductive layer is patterned to form a raised region on the conductive layer. Isolation spacers and conductive spacers are alternately formed on sidewalls of the raised region. The isolation spacers and the conductive spacers are concentrically layered. The isolation spacers are used as masks to remove the conductive spacers and a portion of the patterned conductive layer. The etching barrier layer is used as an etch stop layer. The isolation spacers and a portion of the patterned conductive layer are removed. The remaining patterned conductive layer forms a storage electrode of the capacitor.

20 Claims, 5 Drawing Sheets

METHOD OF FABRICATING A DYNAMIC RANDOM ACCESS MEMORY CAPACITOR

BACKGROUND OF THE INVENTION

1. Field of Invention

The present invention relates to a semiconductor fabricating method. More particularly, the present invention relates to a method of fabricating a Dynamic Random Access Memory (DRAM) capacitor.

2. Description of Related Art

As a function of a microprocessor becomes more powerful, the program and calculation of software becomes more complicated, and thus the need for DRAM storage memory is increased. As the number of semiconductor elements incorporated in integrated circuit increases, a memory cell, which comprises a transfer field effect transistor (TFET) and a storage capacitor, is widely used. In FIG. 1, it is a circuit diagram of a DRAM memory cell. A capacitor C is selected from an array of capacitors used to store information as binary data by charging or discharging the capacitor. Normally, a binary bit is stored in each capacitor. Logic "0" is represented by the discharged state of the capacitor C, whereas logic "1" is represented by the fully charged state of the capacitor C. In general, a dielectric layer 101 is deposited between a top electrode (cell electrode) 102 and a bottom electrode (storage electrode) 100. The capacitor C is electrically coupled with a bit line BL. The read/write operations of a DRAM memory cell are performed by the charged/discharged states of the capacitor C. The bit line BL is connected to the drain of a transfer field effect transistor T. The capacitor C is connected to the source of the transfer field effect transistor T. A signal is transmitted through a gate of the transfer field effect transistor T, which is used to control the capacitor C to turn on or turn off the connection with the bit line BL. In other words, the transfer field effect transistor T acts as a switch to control the charged or discharged state of the capacitor C.

In the DRAM manufacturing process, a two-dimensional capacitor called a planar-type capacitor is mainly used for a conventional DRAM having a storage capacity less than 1M (mega=million) bits. In the case of a DRAM having a memory cell using a planar type capacitor, electric charges are stored on the main surface of a semiconductor substrate, and thus the main surface is required to have a large area. This type of a memory cell is therefore not suited to a DRAM having a high degree of integration. For a highly integrated DRAM, such as a DRAM with more than 4M bits of memory, a three-dimensional capacitor, such as a stacked-type or a trench-type capacitor, has been introduced.

With stacked-type or trench-type capacitors, it has been made possible to obtain a larger memory within a similar volume. However, a capacitor with such a simple three-dimensional structure as the conventional stacked-type or trench-type is insufficient for a semiconductor device of an even higher degree of integration, such as a very-large-scale integration (VLSI) circuit having a capacity of 64M bits.

One solution for improving the capacitance of a capacitor is to use a fin-type stacked capacitor. The fin-type stacked capacitor includes electrodes and dielectric layers which extend in a fin shape in a plurality of stacked layers. Hence, the surface area of the electrode is enlarged while the capacitance is increased. This is described by Ema et al., "3-Dimensional Stacked Capacitor Cell for 16M and 64M DRAMs", International Electron Devices Meeting, pp. 592–595, December 1988, and U.S. Pat. Nos. 5,071,783; 5,126,810; and 5,206,787.

Another solution for improving the capacitance of a capacitor is to use the cylindrical-type stacked capacitor. The cylindrical-type stacked capacitor includes electrodes and dielectric films which extend in a cylindrical shape to increase the surface areas of the electrodes. This is described by Wakamiya et al., Novel Stacked Capacitor Cell for 64-Mb DRAM, 1989 Symposium on VLSI Technology Digest of Technical Papers, pp. 69–70, and U.S. Pat. No. 5,077,688.

With the trend toward increased integration density, the size of the DRAM cell must be further reduced. Generally, a reduction in the size of the cell leads to a reduction in charge storage capacitance. Additionally, as the capacitance is reduced, the likelihood of soft errors arising from the incidence of -rays is increased. Therefore, there is still a need in this art to design a new structure and methods for further increasing the capacitance of a storage capacitor while occupying a smaller area in a plane.

SUMMARY OF THE INVENTION

It is an object of the invention to fabricate capacitors using a simple process that is manufacturing cost effective.

It is another object of the invention to provide a capacitor that is more compatible with simplified manufacturing techniques.

According, the present invention provides a method of fabricating a capacitor. The present invention comprises the steps of providing a substrate having a transfer field effect transistor thereon. A first dielectric layer and an etching barrier layer are formed subsequently on the substrate. The first dielectric layer and the etching barrier layer are patterned to form a contact hole therein. The contact hole exposes a source/drain region. A first conductive layer is formed to fill the contact hole and is electrically coupled with the source/drain region. The first conductive layer is patterned to form a raised region on the first conductive layer. The raised region is just above the contact hole. Isolation spacers and conductive spacers are alternately formed on the sidewall of the raised region. Isolation spacers and conductive spacers are interlaced. The isolation spacers are used as mask. An etching barrier layer is used as an etching stop layer. The isolation spacers and a portion of the patterned conductive layer are removed to expose the storage electrode formed by the conductive layer. A second dielectric layer and a second conductive layer are formed on the electrode to be used as cell electrode.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
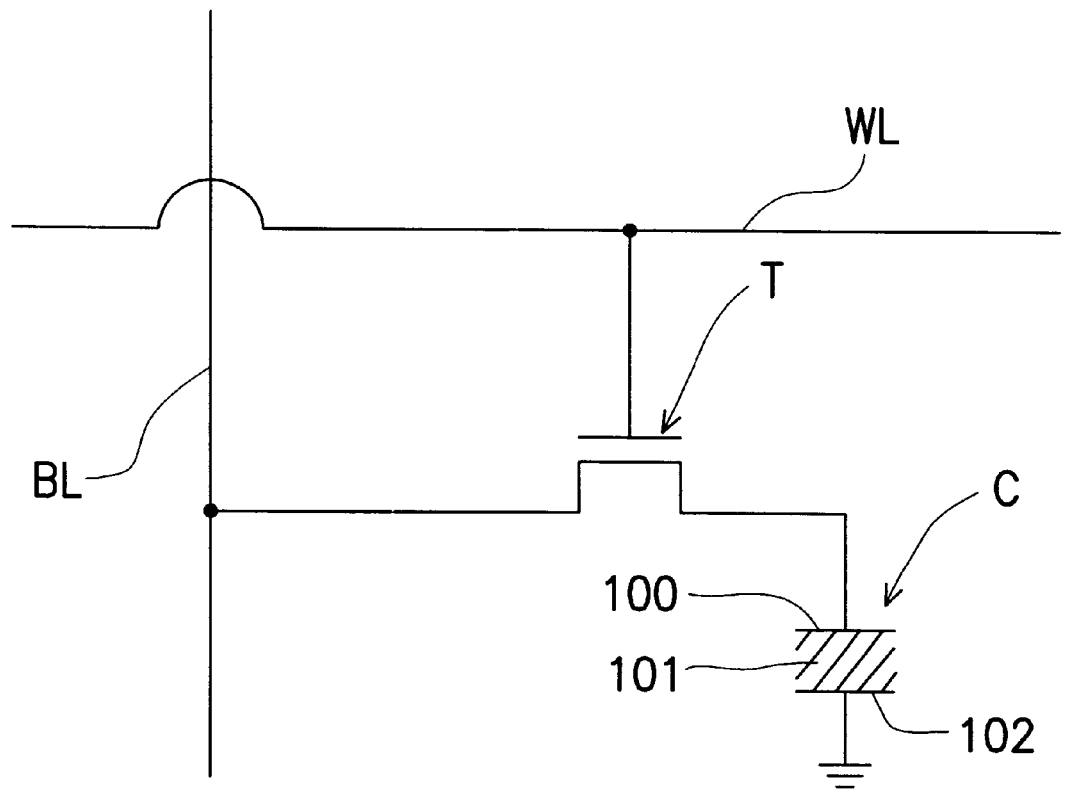
FIG. 1 is a prior art circuit diagram of a dynamic random access memory cell (DRAM).

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2H are cross-sectional views of a portion of a semiconductor device showing a DRAM capacitor fabricating process according to one preferred embodiment of the invention.

Figure 2A:
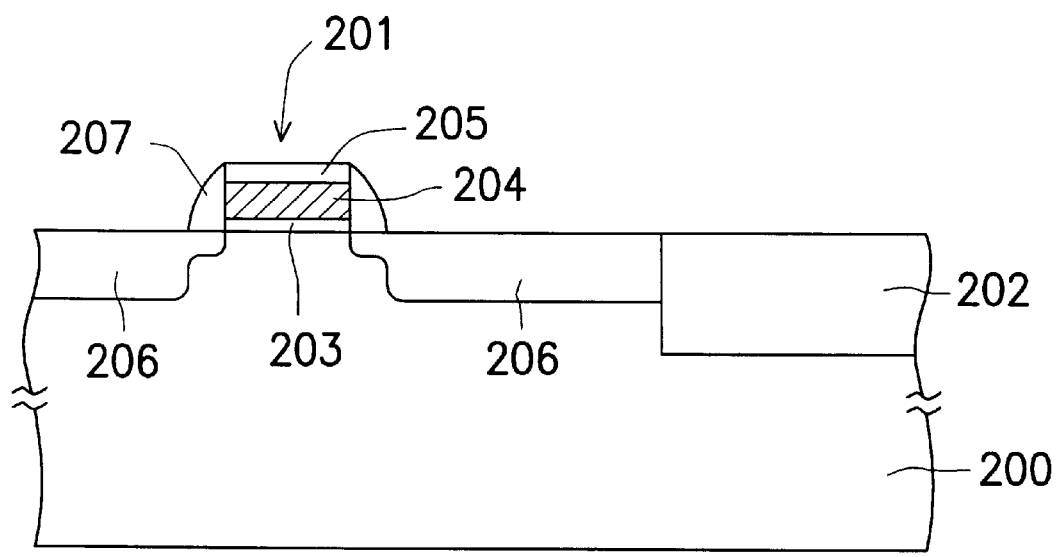
FIGS. 2A through 2H are cross-sectional views of a portion of a semiconductor device showing a DRAM capacitor fabricating process according to one preferred embodiment of the invention.

In FIG. 2A, a substrate 200 is provided. The substrate 200 can be a P-type substrate, for example. An isolation structure 202 is formed in the substrate 200. The isolation structure 202 is used to define an active region. The method of forming an isolation structure 202 can be a location oxidation (LOCOS) method or a shallow trench isolation (STI) method, for example. A field effect transistor 201 is formed on the active region of the substrate 200. The conventional method of forming the field effect transistor 201 includes the steps of forming a thin oxide layer (not shown) on the substrate 200 by using hot oxidation method. A conductive layer (not shown) and an isolation layer (not shown) are formed subsequently on the thin oxide layer. The thin oxide layer, the conducive layer, and the isolation layer are patterned to form a gate oxide layer 203, a gate conductive layer 204, and a gate cap layer 205, by which the field effect transistor 201 is formed. The substrate 200 is doped to form a source/drain region 206 in the substrate 200. An isolation layer (not shown) is formed on the substrate 200. The isolation layer is etched back to form a spacer 207 on the sidewall of the gate oxide layer 203, the conductive gate layer 204, and the gate cap layer 205. The conductive gate layer 204 can be a doped polysilicon layer formed by chemical vapor deposition, for example. The material of the gate cap layer 205 and the spacer 207 can be, for example, silicon nitride. The gate cap layer 205 and the spacer 207 can be formed by using chemical vapor deposition, for example.

Figure 2B:
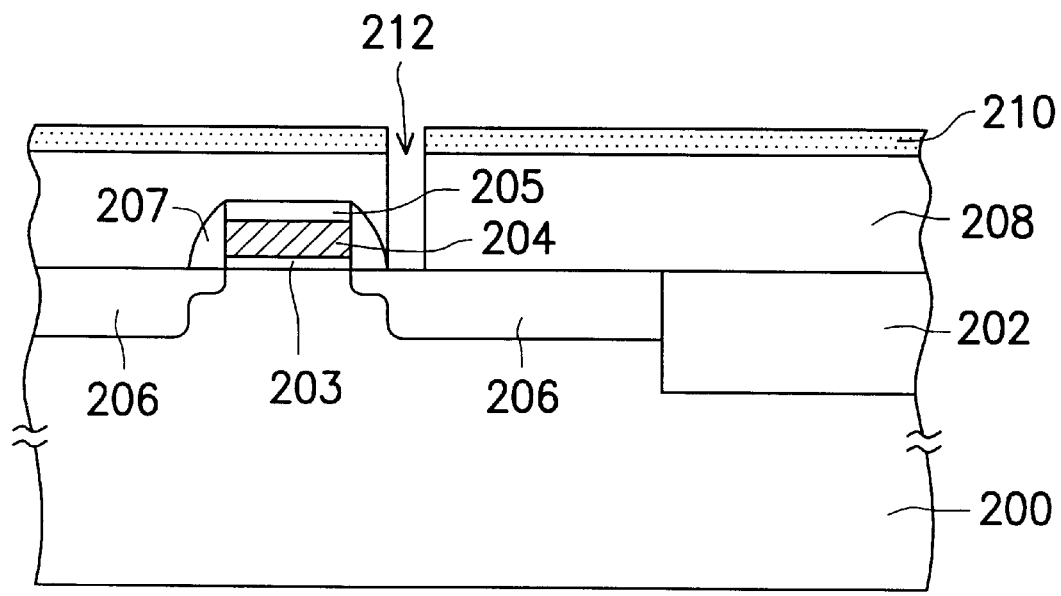

In FIG. 2B, a first dielectric layer 208 and an etching barrier layer 210 are formed in order over the substrate 200. The first dielectric layer 208 and the etching barrier layer 210 are patterned to form a contact hole 212 therein. The contact hole 212 exposes the source/drain region 206. The material of the first dielectric layer 208 can be, for example, silicon oxide or borophosphosilicate glass (BPSG). The first dielectric layer 208 can be, formed by using chemical vapor deposition, for example. The etching rate of the etching barrier layer 210 is different from the etching rate of the first dielectric layer 208. The etching barrier layer 210 can be, for example, a silicon nitride ($SiN_x$) layer or a silicon oxide nitride ($SiO_yN_z$) layer formed by using chemical vapor deposition.

Figure 2C:
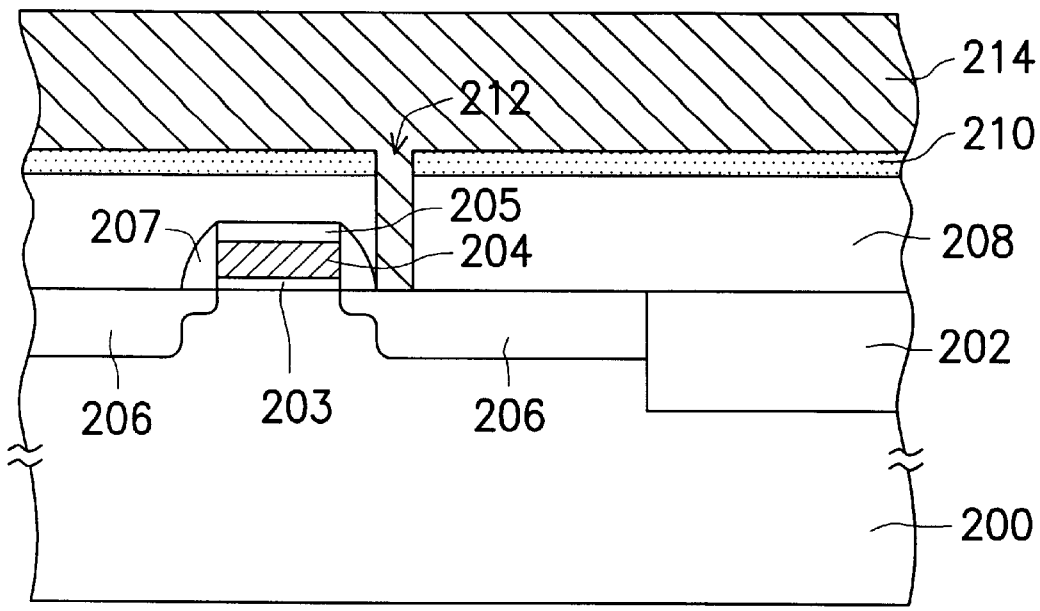

In FIG. 2C, a first conductive layer 214 is formed over the substrate 200. The first conductive layer 214 covers the etching barrier layer 210. The first conductive layer 214 can be a doped-polysilicon layer or an in situ doped polysilicon layer formed by using chemical vapor deposition, for example. The first conductive layer 214 can be doped with a dopant, such as n-type ions, in order to increase its conductivity. The first conductive layer 214 fills the contact hole 212 and is electrically coupled with the source/drain region 206.

Figure 2D:
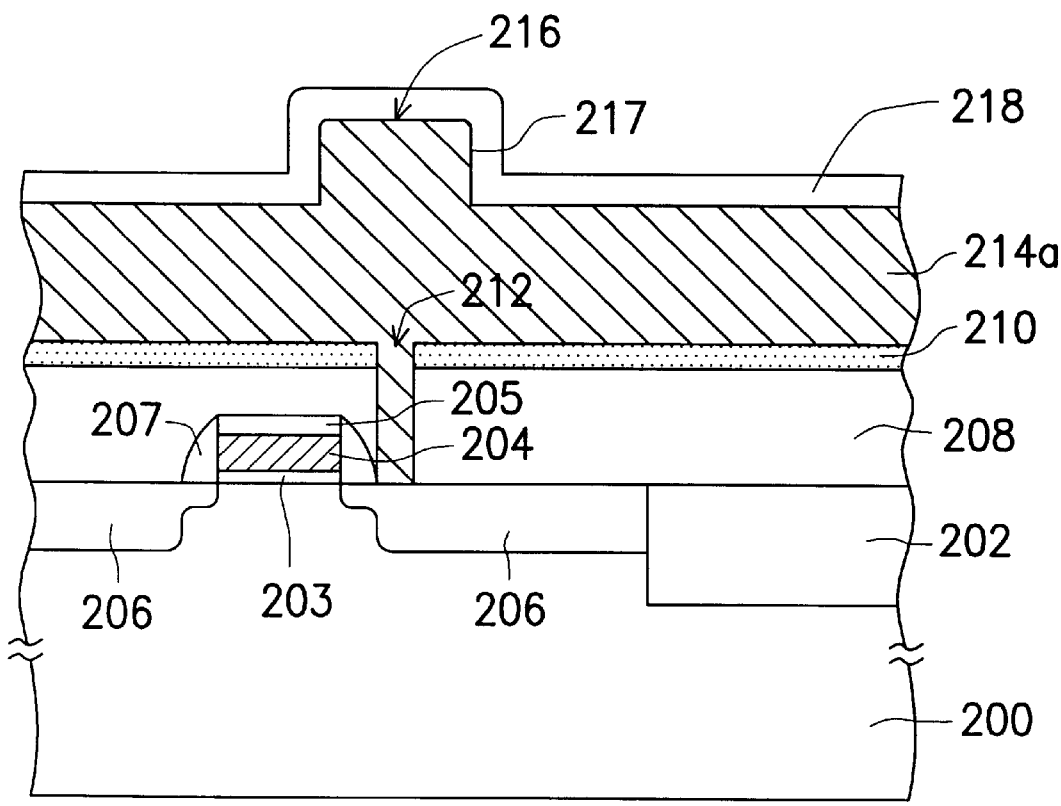

In FIG. 2D, a portion of the first conductive layer 214 is patterned to form a patterned first conductive layer 214a with a raised region 216. The raised region 216 is on the first conductive layer 214a above the contact hole 212. An isolation layer 218 is formed on the patterned first conductive layer 214a. The isolation layer 218 and the first conductive layer 214a have different etching rates. The material of the isolation layer 218 can be silicon oxide, for example.

For example, tetra-ethyl-ortho-silicate (TEOS) is used as a reactant gas to form a TEOS silicon oxide isolation layer. The TEOS silicon oxide isolation layer is formed by using low-pressure chemical vapor deposition, for example.

Figure 2E:
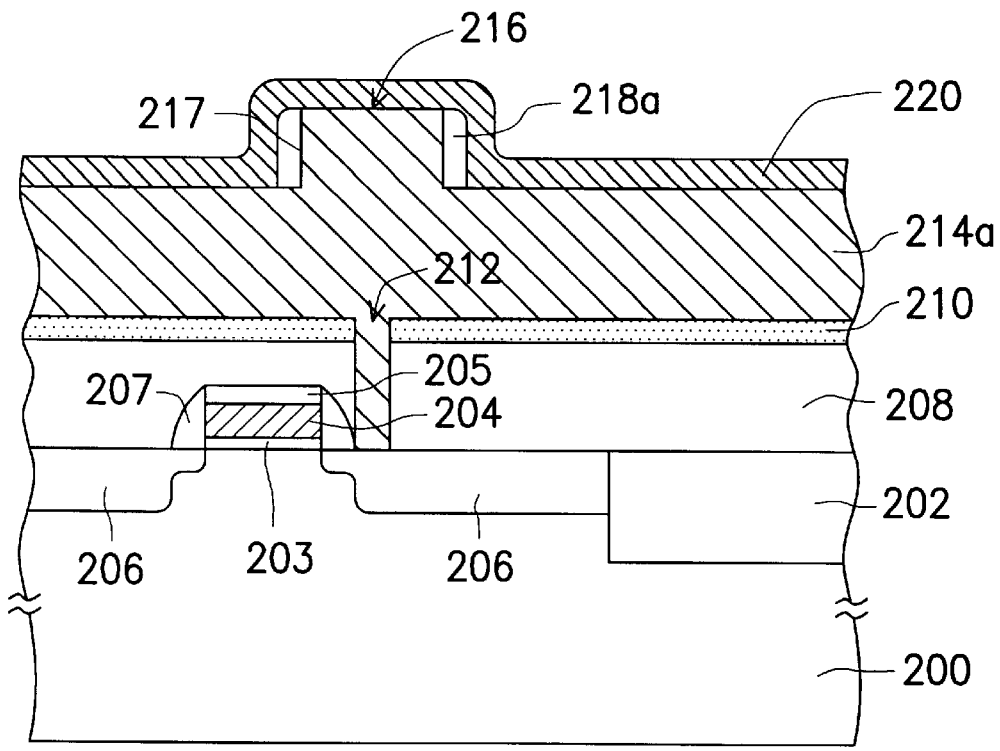

In FIG. 2E, the isolation layer 218 is etched back. An isolation spacer 218a is formed on the sidewall of the raised region 216. A second conductive layer 220 is formed over the substrate 200. The etching back method can be an anisotropic etching method, such as a dry plasma etching method, for example. The second conductive layer 220 and the isolation layer 218 have different etching rates. The second conductive layer 220 can be, for example, a polysilicon layer formed by using a chemical vapor deposition method.

Figure 2F:
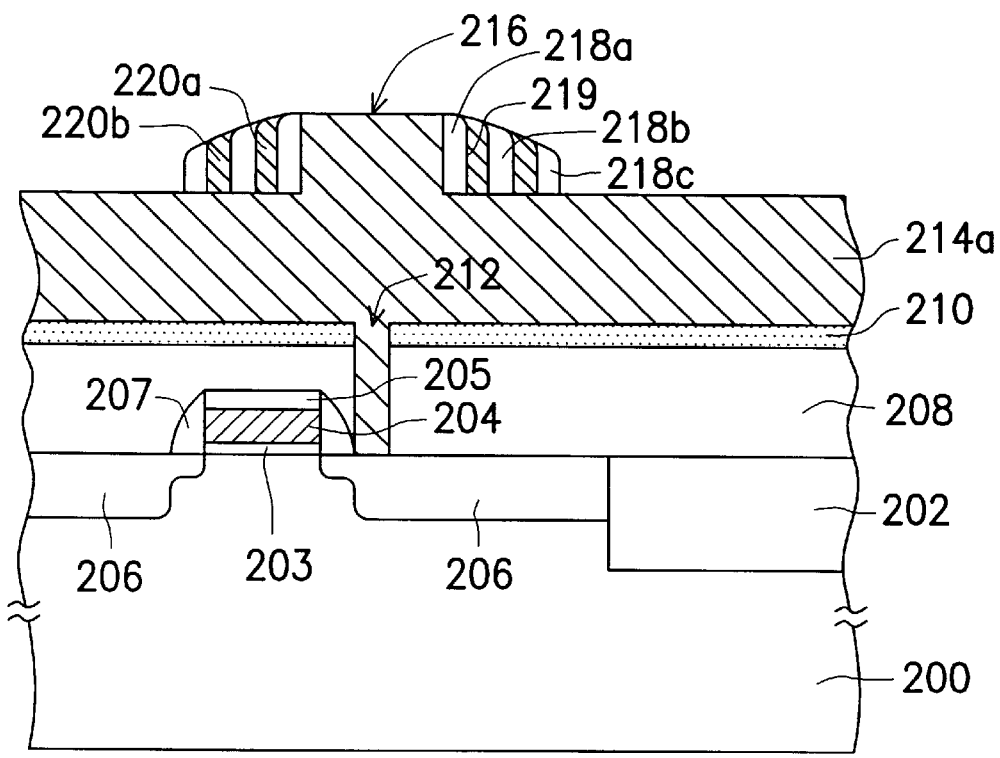

In FIG. 2F, the second conductive layer is etched back to from a conductive spacer 220a on the sidewall of the isolation spacer 218a. After repeating the steps of forming the isolation spacer 218a and the conductive spacer 220a, more isolation spacers, and more conductive spacers such as isolation spacers 218b, 218c and conductive spacer 220b are formed alternately on the sidewall of the raised region 216. The isolation spacers and the conductive spacers are concentric. The etching back method includes anisotropic etching, such as dry plasma etching.

Figure 2G:
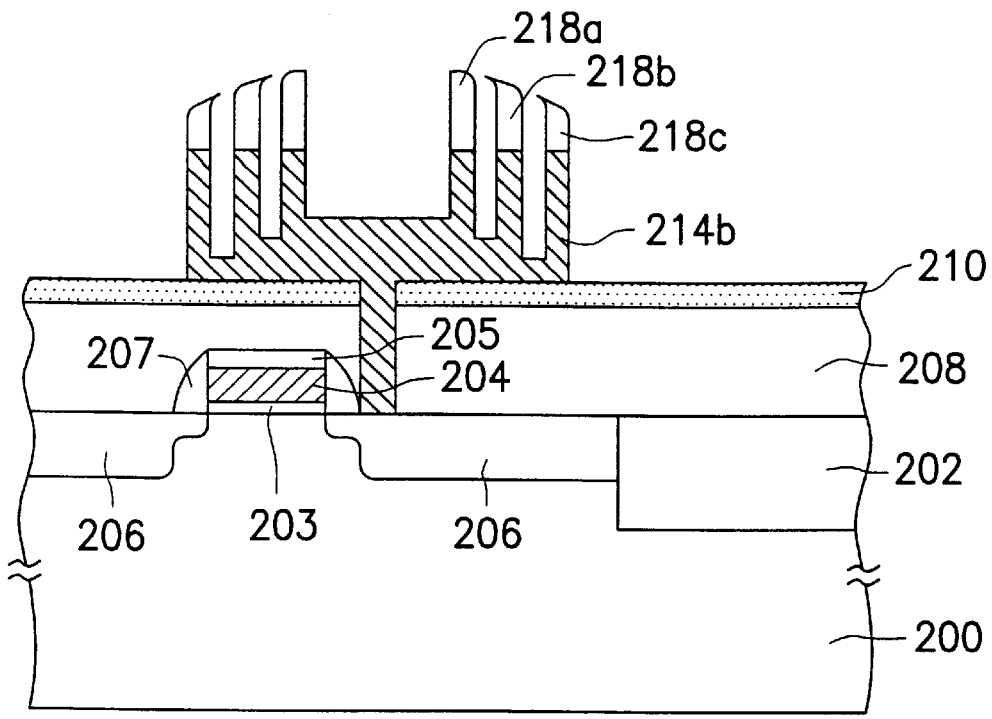

In FIG. 2G, the isolation spacers 218a, 218b, and 218c are used as masks. The etching barrier layer 210 is used as an etching stop layer. The conductive spacer 220a, the conductive spacer 220b, and a portion of the patterned first conductive layer 214a are removed. The reaming first conductive layer 214b is cylindrical in shape. The etching rates of the isolation spacers 218a, 218b, 218c, and the etching barrier layer 210 are different from that of the first conductive layer 214a so that the isolation spacers 218a, 218b, and 218c can be used as etching masks and etching barrier layer 210 can serve as an etch stop layer while removing portions of the first conductive layer 214a. The method of removing portions of the patterned first conductive layer 214a and conductive spacers 220a, 220b includes anisotropic etching, such as dry plasma etching.

Figure 2H:
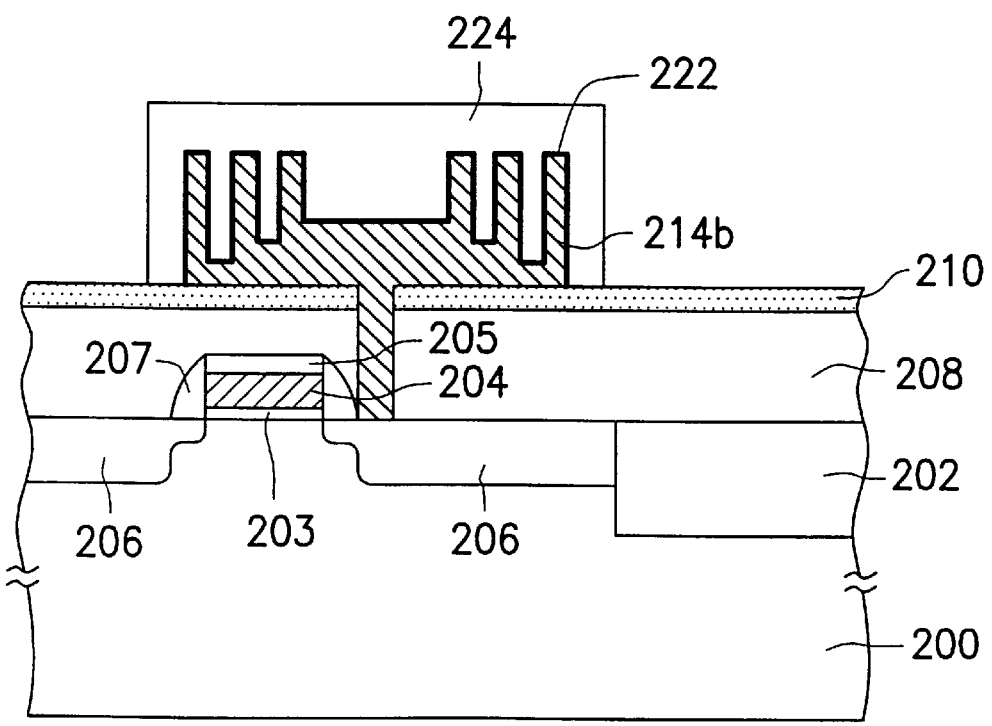

In FIG. 2H, the isolation spacers 218a, 218b, and 218c are removed to expose a first conductive layer 214b. A cylinder-shape storage electrode formed by the first conductive layer 214b is formed. A second dielectric layer 222 is formed on a surface of the first conductive layer 214b and etching barrier layer 210. A second conductive layer 224 is formed over the substrate 200 to define a cell electrode. A capacitor is formed. The isolation spacers 218a, 218b, and 218c can be removed by an isotropic etch step such as a wet etching step performed by using HF as an etchant. The second dielectric layer 222 can be, for example, a silicon oxide layer, a silicon nitride/silicon oxide (NO) layer, a silicon oxide/silicon nitride/silicon oxide (ONO) layer, a $Ta_2O_5$ layer, a $Pb(Zr, Ti)O_3$ layer (PZT layer), a $(Ba, Sr)TiO_3$ layer (BST) layer, or other layer with high dielectric contact. The second conductive layer can be a polysilicon layer formed by chemical vapor deposition, for example. In addition, the polysilicon layer is in-situ doped.

In summary, the characteristic of the present invention is to form a storage electrode by using the different etching rates of the isolation layer and the conductive layer. Hence, the effective area of the storage electrode is enlarged while still in a limited planar area. The present invention can be fabricated more easily, and thus the manufacturing cost decreases while the process tolerance and the product yield increase.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a capacitor, wherein the method comprises the steps of:

providing a substrate having a field effect transistor thereon, where in the field effect transistor includes a source/drain region;

sequentially forming a first dielectric layer and an etching barrier layer on the substrate;

patterning the first dielectric layer and the etching barrier layer to form a contact hole in the first dielectric layer and the etching barrier layer, wherein the contact hole exposes the source/drain region;

forming a first conductive layer to fill the contact hoe, wherein the first conductive layer covers the etching barrier layer, and the first conductive layer is electrically coupled with the source/drain region;

patterning the first conductive layer to form a raised region on the firs conductive layer, wherein the raised region is above the contact hole;

alternately forming isolation spacers and conductive spacers on sidewalls of the raised region, wherein the isolation spacers and the conductive spacers are concentrically layered;

using the isolation spacers as etching masks and the etching barrier layer as an etching stop layer to remove the conductive spacers and a portion of the patterned first conductive layer;

removing the isolation spacers to form a storage electrode;

forming a second dielectric layer on a surface of the storage electrode; and forming a second conductive layer over the substrate to form a cell electrode.

2. The method of claim 1, wherein the etching barrier layer and the first conductive layer have different etching rates.

3. The method of claim 2, wherein the etching barrier layer includes a silicon nitride layer.

4. The method of claim 2, wherein the etching barrier layer includes a silicon oxide nitride layer.

5. The method of claim 2, wherein the first conductive layer includes a doped polysilicon layer.

6. The method of claim 1, wherein the isolation spacers and the conductive spacers have different etching rates, and the isolation spacers and the first conductive layer have different etching rates.

7. The method of claim 6, wherein a material of the isolation spacers includes silicon oxide, and a material of the conductive spacers and the first conductive layer includes doped polysilicon.

8. The method of claim 7, wherein the step of forming isolation spacers includes low-pressure chemical vapor deposition.

9. The method of claim 8, wherein the step of forming isolation spacers includes using tetra-ethyl-ortho-silicate as a reactant gas.

10. The method of claim 1, wherein the step of forming the isolation spacers includes:

forming a isolation layer on the substrate; and removing the isolation layer by anisotropic etching.

11. The method of claim 1, wherein the step of forming the conductive spacers includes:

forming a third conductive layer on the substrate; and removing the third conducive layer by anisotropic etching.

12. The method of claim 1, wherein the step of removing the conductive spacers and a portion of the patterned first conductive layer includes anisotropic etching.

13. The method of claim 12, wherein the step of removing the conductive spacers and a portion of the patterned first conductive layer includes dry etching.

14. The method of claim 1, wherein the step of removing the isolation spacers includes isotropic etching.

15. The method of claim 14, wherein the step of removing the isolation spacers includes wet etching.

16. The method of claim 1, wherein the second dielectric layer includes a silicon oxide layer.

17. The method of claim 1, wherein the second dielectric layer includes a silicon nitride/silicon oxide (NO) layer.

18. The method of claim 1, wherein the second dielectric layer includes an silicon oxide/silicon nitride/silicon oxide (ONO) layer.

19. The method of claim 1, wherein the second dielectric layer includes a $Ta_2O_5$ layer.

20. The method of claim 1, wherein the second conductive layer includes a doped polysilicon layer.

* * * * *